(12) United States Patent
Duan et al.

(10) Patent No.: US 9,525,492 B2
(45) Date of Patent: Dec. 20, 2016

(54) METHOD FOR CONTROLLING THE WAVELENGTH OF A LASER SOURCE

(71) Applicant: Commissariat à l'énergie atomique et aux énergies alternatives, Paris (FR)

(72) Inventors: Guang-Hua Duan, Palaiseau (FR); Romain Brenot, Palaiseau (FR); Alban Le Liepvre, Marcoussis (FR); Bruno Mourey, Grenoble Cedex (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 12 days.

(21) Appl. No.: 14/617,991

(22) Filed: Feb. 10, 2015

(65) Prior Publication Data

US 2015/0236793 A1    Aug. 20, 2015

(30) Foreign Application Priority Data

Feb. 17, 2014    (EP) .................................... 14305213

(51) Int. Cl.
| | |
|---|---|
| *H01S 3/10* | (2006.01) |
| *H04B 10/572* | (2013.01) |
| *H04B 10/50* | (2013.01) |
| *H04B 10/079* | (2013.01) |
| *H04B 10/27* | (2013.01) |

(52) U.S. Cl.
CPC ........ *H04B 10/572* (2013.01); *H04B 10/0795* (2013.01); *H04B 10/27* (2013.01); *H04B 10/503* (2013.01)

(58) Field of Classification Search
CPC ... H04B 10/27; H04B 10/0795; H04B 10/572; H04B 10/503
USPC ................................ 372/20; 398/28; 385/11
See application file for complete search history.

(56) References Cited

U.S. PATENT DOCUMENTS

2012/0219024 A1    8/2012 Okamoto et al.
2013/0322472 A1    12/2013 Li

OTHER PUBLICATIONS

G-H Duan et al: "Integrated hybrid III V/Si laser and transmitter", Indium Phosphide and Related Materials (IPRM), 2012 International Conference on, IEEE, Add. (Aug. 27, 2012), pp. 16-19.*

(Continued)

*Primary Examiner* — Tuan Nguyen
(74) *Attorney, Agent, or Firm* — B. Aaron Schulman, Esq.; Stites & Harbison, PLLC (57) ABSTRACT

The present invention concerns a method for controlling the emitting wavelength of a laser source (10) for a passive optical network, the laser source (10) comprising:
  a first Bragg mirror (12),
  a second Bragg mirror (14),
  a cavity (16) delimited by both Bragg mirrors (12, 14), the cavity (16) comprising an optical filter (18) and an active medium (20),
the method comprising the steps of:
  measuring the temperature of the active medium (20),
  setting the temperature of the optical filter (18) in accordance with the measured temperature of the active medium (20), the temperature of the optical filter (18) being higher than the measured temperature.

19 Claims, 4 Drawing Sheets

(56) References Cited

OTHER PUBLICATIONS

Duan G-H et al: "10 Gb/s integrated tunable hybrid III-V/Si laser and silicon Mach-Zehnder moduli", 2012 38th European Conference and Exhibition on Optical Communications, OSA, (Sep. 16, 2012), pp. 1-3.*

Alban Le Liepvre et al: "Wavelength Selectable Hybrid 111 V/ Si Laser Fabricated by Wafer Bonding", IEEE Photonics Technology Letters, IEEE Service Center, Piscataway, NJ, US, vol. 25, No. 16, Aug. 1, 2013 (Aug. 1, 2013), pp. 1582-1585.*

European Search Report for EP 14 30 5213 dated Apr. 30, 2014.

Duan G-H et al: 10 Gb/s integrated tunable hybrid III-V/Si laser and silicon Mach-Zehnder moduli', 2012 38European Conference and Exhibition on Optical Communications, OSA, (Sep. 16, 2012), p. 1-3.

Alban Le Liepvre et al: "Wavelength Selectable Hybrid III V/Si Laser Fabricated by Wafer Bonding", IEEE Photonics Technology Letters, IEEE Service Center, Piscataway, NJ, US, vol. 25, No. 16, (Aug. 1, 2013), pp. 1582-1585.

Le Liepvre A et al: "A wavelength selectable hybrid III-V/Si laser fabricated by wafer bon", 10th International Conference on Group IV Photonics, IEEE, (Aug. 28, 2013), pp. 150-151.

Chen Hao et al: "A low-cost multi-wavelength laser based on hybrid integration technology for WDM-PON application", 2013 12th International Conference on Optical Communications and Networks (ICOCN), IEEE, (Jul. 26, 2013), pp. 1-4.

* cited by examiner

METHOD FOR CONTROLLING THE WAVELENGTH OF A LASER SOURCE

TECHNICAL FIELD OF THE INVENTION

The invention relates to a method for controlling the emitting wavelength for a laser source of a passive optical network and the associated laser source.

BACKGROUND OF THE INVENTION

A passive optical network (PON) is a telecommunications network that uses point-to-multipoint fiber to the premises in which unpowered optical splitters are used to enable a single optical fiber to serve multiple premises. A PON consists of an optical line terminal (OLT) at the service provider's central office and a number of optical network units (ONUs) near end users. A PON reduces the amount of fibers and central office equipments required compared with point-to-point architectures. A passive optical network is a form of fiber-optic access network.

At the April 2012 meeting of the Full Service Access Network (FSAN) group, time and wavelength division multiplexed passive optical network (TWDM-PON) technology was chosen as the primary solution for next-generation passive optical network stage-2 (NG-PON2) architecture. Such passive optical network PON are notably used in local access networks (LAN).

In time and wavelength division multiplexed PON, tunable transmitters are required at the Optical Network Unit (ONU). It is therefore desired to design a cost-effective wavelength tunable laser source for time and wavelength division multiplexed PON.

For this, it is known to use an external cavity laser or sample grating distributed Bragg reflector lasers.

However, as these kinds of laser sources are developed mainly for long-haul applications, the resulting cost is too high for applications in local access networks. In addition, a temperature control is required to assure a single mode operation of the laser source and to allow the control of the wavelength emitted by the laser source.

DFB lasers are also used for time and wavelength division multiplexed PON. A distributed feedback laser (DFB) is a type of laser diode, quantum cascade laser or optical fibre laser where the active region of the device is periodically structured such that a diffraction grating is incorporated. The structure builds a one dimensional interference grating (Bragg scattering) and the grating provides optical feedback for the laser.

Nevertheless, the tuning range of such type of laser source is limited since the wavelength tunability is of the order of 3.2 nm (corresponding to a thermal tunability of roughly 0.08 nm/K and a temperature change of 40 K). In addition, the output power of the laser source is reduced along the wavelength tuning due to the heating carried out for obtaining wavelength tuning.

SUMMARY OF THE INVENTION

There is therefore a need for a wavelength tunable solution for time and wavelength division multiplexed passive optical network with an improved tunability.

To this end the invention concerns a method for controlling the emitting wavelength of a laser source for a passive optical network, the laser source comprising a first Bragg mirror, a second Bragg mirror, a cavity delimited by both Bragg mirrors, the cavity comprising an optical filter and an active medium. The method comprises the steps of measuring the temperature of the active medium, setting the temperature of the optical filter in accordance with the measured temperature of the active medium, the temperature of the optical filter being higher than the measured temperature.

Thanks to the invention uncooled operation can be achieved with less power degradation due to the temperature increase (as the detuning between the gain peak of the active medium and the emitting wavelength is reduced compared to the other devices used in the prior art).

In addition, the wavelength tuning is achieved through the temperature change of the optical filter which is a passive function. As a consequence the output power is not impacted by the heating of active layer as in the case of tunable DFB lasers. In other words, there is very small power level degradation due to wavelength tuning compared to a thermally wavelength tunable DFB laser. Therefore, such laser source enables to obtain an improved output power over the whole range of possible emitting wavelength.

For these reasons, the laser source proposed is a low-cost, uncooled optical network unit transmitter for next-generation passive optical network stage-2, that is time and wavelength division multiplexed passive optical network.

According to further aspects of the invention which are advantageous but not compulsory, the method might incorporate one or several of the following features, taken in any technically admissible combination:

- the active medium is made from at least one semiconductor material belonging to the group III of the Periodic Table of Elements and at least one semiconductor material belonging to the group V of the Periodic Table of Elements.
- the laser source is a monolithic integrated source.
- the method further comprises a step of comparing the measured temperature of the active medium with at least two main temperature thresholds, the temperature of the optical filter being set to a temperature ranging from a first number to a second number, wherein the first number is the sum of the main temperature threshold which is the nearest inferior to the measured temperature and the mean interval of temperature between each successive main temperature thresholds, and the second number is the sum of the main temperature threshold which is the nearest inferior to the measured temperature and the product of the mean interval of temperature between each successive main temperature thresholds by a constant, the constant ranging from 1 to 3.
- the interval of temperature between each successive main temperature thresholds is constant.
- the mean interval of temperature between each successive main temperature thresholds is inferior or equal to 60 K.
- the step of setting further comprises providing data relative to the evolution with temperature of the gain wavelength for the active medium, the gain wavelength corresponding to a gain curve peaks of the active medium for the cavity, determining the gain wavelength at the measured temperature with the provided data, determining the nearest superior temperature to the measured temperature to impose to the optical filter such that the transmission function of the optical filter exhibits a peak of transmission at the determined wavelength, and heating the optical filter to the nearest superior temperature determined.
- the active medium comprises several selectable active elements and the method further comprises the step of

- selecting one active element in accordance with the measured temperature of the active medium.
- the method further comprises a step of comparing the measured temperature of the active medium with at least one auxiliary temperature threshold, the active element being selected in accordance with the auxiliary temperature threshold(s) to which the measured temperature is superior.
- the number of auxiliary temperature thresholds comprised between two successive main temperature thresholds is equal to the number of selectable active elements plus one.
- the mean interval of temperature between each successive auxiliary temperature thresholds is inferior or equal to 20 K.
- the active medium comprises at least four selectable active elements.
- the optical filter is chosen in the group consisting of an arrayed waveguide grating, a ring resonator, several ring resonators sharing the same output waveguides and a combination of a ring resonator and a Mach-Zehnder interferometer.

The invention also concerns a laser source for a passive optical network comprising a first Bragg mirror, a second Bragg mirror, a cavity delimited by both Bragg mirrors, the cavity comprising an optical filter and an active medium, and a controller adapted to carry out the method for controlling the emitting wavelength of the laser source as described previously.

It is also proposed an optical network unit comprising a laser source as described previously.

BRIEF DESCRIPTION OF THE DRAWINGS

The invention will be better understood on the basis of the following description which is given in correspondence with the annexed figures and as an illustrative example, without restricting the object of the invention. In the annexed figures.

DETAILED DESCRIPTION OF SOME EMBODIMENTS

A laser source 10 is proposed for a passive optical network.

Preferably, the passive optical network is a time and wavelength division multiplexed network The laser source 10 is a laser source comprising a first Bragg mirror 12, a second Bragg mirror 14 and a cavity 16 which is delimited by both Bragg mirrors 12 and 14.

A Bragg mirror is a succession of multiple thin layers with different refractive index. The Bragg mirror enables to reflect, thanks to constructive interference phenomena, a controllable portion of the incident energy.

The cavity 16 comprises an optical filter 18 and an active medium 20.

In this case, an optical filter is a filter with an optical transmission having resonance at given frequencies. The interval between each resonance frequencies is generally constant so that a free spectral range can be defined. Each resonance is also labeled a peak transmission.

As an example, the optical filter 18 is chosen in the group consisting of an arrayed waveguides grating, a ring resonator, several ring resonators sharing the same output waveguides and a combination of a ring resonator and a Mach-Zehnder interferometer. Such examples are further described below, notably in reference to FIGS. 1, 4 and 6.

According to the embodiments, the active medium 20 comprises a single active element or several active elements and/or respective phase section(s). In case the active medium 20 comprises several active elements, it is preferred that the active elements be selectable.

In addition, so as to facilitate the manufacturing of the laser source, it is preferred that the active medium 20 be made from at least one semiconductor material belonging to the group III and at least one semiconductor material belonging to the group V. The group III of the Periodic Table of Elements is also labeled group 13 of the periodic table. It corresponds to the boron group and notably comprises boron (B), aluminium (Al), gallium (Ga) and indium (In). The group V of the Periodic Table of Elements is also labeled group 15 of the periodic table. This group is also known as the nitrogen family. The chemical elements of this group are called pnictogens. Nitrogen (N), phosphorus (P), arsenic (As) and antimony (Sb) are examples of pnictogens.

So as to improve this effect, it is preferable that the laser source 10 be a monolithic integrated source. In such a case, the link between the different elements is achieved by waveguides in silicon or in III-V based material.

The laser source 10 also comprises a controller 23 adapted to carry out a method for controlling the emitting wavelength of the laser source 10.

This method for controlling the emitting wavelength of a laser source 10 comprises at least two steps.

The method comprises a step of measuring the temperature of the active medium 20.

Such measurement is achieved by using a temperature sensor.

In case the laser source 10 is in a thermalized environment, the step of measuring the temperature of the active medium 20 is, according to a specific embodiment, achieved by measuring the temperature of the environment, also named the ambient temperature.

At the end of the step of measuring, the temperature of the active medium 20, labeled $T_{MEASURED}$, is obtained.

The method also comprises a step of setting the temperature $T_{FILTER}$ of the optical filter 18 in accordance with the measured temperature $T_{MEASURED}$ of the active medium 20, the temperature $T_{FILTER}$ of the optical filter 18 being higher than the measured temperature $T_{MEASURED}$. In other words, the temperature $T_{FILTER}$ of the optical filter 18 is strictly superior to the measured temperature $T_{MEASURED}$, which means $T_{FILTER} > T_{MEASURED}$.

When a heater is integrated with the filter 18, such step of setting is achieved by heating the filter 18 with the heater.

Such method enables to control the emitted wavelength of a laser source 10 without using a cooler.

In addition, there is very small power level degradation due to ambient temperature change owing to the reduced mismatch between the gain peak of the active medium 20 and the lasing wavelength of the laser source 10.

In a preferred embodiment, the method further comprises a step of comparing the measured temperature $T_{MEASURED}$ of the active medium 20 with at least two main temperature thresholds.

In the remainder of the specification, for illustrative purpose only, it will be considered that there are three different main temperature thresholds, respectively labeled first main temperature threshold $T_{1,1}$, second main temperature threshold $T_{1,2}$ and third main temperature threshold $T_{1,3}$.

This number of three is a good trade-off between limiting the number of comparisons carried out at the step of comparing and taking into account the behavior of the active medium 20 in normal conditions of operating. However, the person skilled in the art is able to apply the detailed method and properties below to other number of different main temperature thresholds.

Each main temperature thresholds $T_{1,1}$, $T_{1,2}$ and $T_{1,3}$ are spaced from the same temperature interval from the nearest temperature. In other words, the temperature interval between the first main temperature thresholds $T_{1,1}$ and the second main temperature threshold $T_{1,2}$ is identical to the temperature interval between the second main temperature threshold $T_{1,2}$ and the third main temperature threshold $T_{1,3}$.

For the remainder of the specification, the temperature interval between each subsequent main temperature threshold is called the first temperature interval $\Delta T1$.

More generally, in case at least one temperature interval between each subsequent main temperature threshold is different from the other one, a mean temperature interval between each subsequent main temperature threshold can be defined. In this context, the first temperature interval $\Delta T1$ refers to the arithmetic average of each temperature interval between each subsequent main temperature threshold, which is the mean temperature interval between each subsequent main temperature threshold.

Preferably, the first temperature interval $\Delta T1$ is chosen to be inferior or equal to 60 K, so as to better represent the behavior of the active medium 20 in normal conditions of operating.

In order to improve the above-mentioned effect, the first temperature interval $\Delta T1$ is chosen to be inferior or equal to 50 K.

In addition, in normal condition of operating, it is convenient that the three main temperature thresholds $T_{1,1}$, $T_{1,2}$ and $T_{1,3}$ be respectively equal to −20° C., 30° C. and 80° C. Mathematically, this means that:

$T_{1,1}$=−20° C.;
$T_{1,2}$=30° C.;
$T_{1,3}$=80° C.

Alternatively, this property could be reworded in the following way: the three main temperature thresholds $T_{1,1}$, $T_{1,2}$ and $T_{1,3}$ are respectively equal to 253 K, 303 K and 353 K since X° C.=(X+273) K where in X is a number. For the remainder of the description, it is chosen to express the temperature in (° C.) rather than in Kelvin (K) since it is more usual to express ambient temperatures in Celsius degree. The differences of temperature are, in contrast, expressed in Kelvin.

In this case, at the step of setting the temperature $T_{FILTER}$ of the optical filter 18, the temperature $T_{FILTER}$ is set in accordance with the result of the comparing step.

For instance, the temperature $T_{FILTER}$ of the optical filter 18 is set to a temperature ranging from a first number to a second number. By definition, a value X ranges from Y to Z if the value X fulfills the inequalities Y≤X≤Z. The first number is the sum of the nearest inferior main temperature threshold to the measured temperature $T_{MEASURED}$ and the value of the first temperature interval $\Delta T1$. The second number is the sum of the nearest inferior main temperature threshold to the measured temperature $T_{MEASURED}$ and the product of a constant with the value of the first temperature interval $\Delta T1$. Mathematically, the corresponding inequalities read:

$$T_{1,J}+\Delta T1 \leq T_{FILTER} \leq T_{1,J}+\alpha*\Delta T1$$

wherein:
$T_{1,J}$ is the nearest inferior main temperature threshold to the measured temperature $T_{MEASURED}$, and
$\alpha$ is the constant.

The constant $\alpha$ ranges from 1 to 3. The constant $\alpha$ depends on the required tuning range. Mathematically, the corresponding inequalities read:

$$1 \leq \alpha \leq 3$$

Alternatively, the previous inequalities may become:

$$T_{1,J+1} \leq T_{FILTER} \leq T_{1,J+1}+(\alpha-1)*\Delta T1$$

wherein:
$T_{1,J+1}$ is the nearest superior main temperature threshold to the measured temperature, and
$\alpha$ is the constant.

Indeed, the sum of the nearest inferior main temperature threshold to the measured temperature $T_{MEASURED}$ and the value of the first temperature interval $\Delta T1$ is equal to the nearest superior main temperature threshold $T_{1,J+1}$ to the measured temperature $T_{MEASURED}$.

Preferably, the constant $\alpha$ is equal to 2.6 if a wavelength tuning range of 5.6 nm (8 channels with 100 GHz channel spacing) is specified. In this case, the previous inequalities for the temperature $T_{FILTER}$ of the optical filter 18 become:

$$T_{1,J}+\Delta T1 \leq T_{FILTER} \leq T_{1,J}+2.6*\Delta T1$$

When the first temperature interval $\Delta T1$ is equal to 50 K, the previous inequalities for the temperature $T_{FILTER}$ of the optical filter 18 read:

$$T_{1,J}+50 K \leq T_{FILTER} \leq T_{1,J}+130 K$$

According to a more sophisticated alternative embodiment, the step of setting the temperature $T_{FILTER}$ of the optical filter 18 comprises four substeps.

During the first substep, are provided data relative to the evolution with temperature of the gain wavelength for the active medium 20. By definition, the gain wavelength corresponds to a gain curve peaks of the active medium 20 for the cavity 16.

Such providing steps can be carried out by acquiring data, by calculating data or by providing datasheet.

The step of setting the temperature $T_{FILTER}$ of the optical filter 18 further comprises a second substep of determining the gain wavelength at the measured temperature $T_{MEASURED}$ with the provided data. At the end of this second substep, a determined wavelength $\lambda_{DETERMINED}$ is obtained. In the context of this invention, the substep of determining is carried out by the controller 23. For instance, the controller 23 uses a corresponding table.

During the third substep, it is determined the nearest superior temperature $T_{FILTER}$ to the measured temperature $T_{MEASURED}$ to impose to the optical filter 18 such that the transmission function of the optical filter 18 exhibits a peak of transmission at the determined wavelength $\lambda_{DETERMINED}$. At the end of this third substep, a determined temperature $T_{DETERMINED}$ is obtained.

The step of setting the temperature $T_{FILTER}$ of the optical filter 18 further comprises heating the optical filter 18 to the nearest superior temperature determined $T_{DETERMINED}$.

According to another embodiment, the active medium 20 comprises several selectable active elements.

Notably, as example, each selectable active element is a semiconductor optical amplifier.

Semiconductor optical amplifiers (SOAs) are amplifiers which use a semiconductor to provide the gain medium. These amplifiers have a similar structure to Fabry-Pérot laser diodes but without any reflecting faces. Semiconductor optical amplifiers are typically made from group III-V compound semiconductors such as GaAs/AlGaAs, InP/InGaAs, InP/InGaAsP and InP/InAlGaAs, though any direct band gap semiconductors such as II-VI could conceivably be used.

Preferably, in this case, the optical filter 18 has a transmission function for which a free spectral range can be defined and the active medium 20 comprises several selectable active elements for which an active element gain wavelength can be defined, the active element gain wavelength corresponding to a gain curve peak for the cavity 16, the difference between the different active element gain wavelength being inferior to the free spectral range of the optical filter 18.

The method further comprises a step of selecting one active element in accordance with the measured temperature $T_{MEASURED}$ of the active medium 20.

Similarly to the comparing step detailed above in reference to the optical filter 18, preferably, the method further comprises a step of comparing the measured temperature $T_{MEASURED}$ of the active medium 20 with at least one auxiliary temperature threshold, the active element being selected in accordance with the auxiliary temperature threshold to which the measured temperature $T_{MEASURED}$ is superior.

When relevant, the same remarks made for the main temperature thresholds may apply to the auxiliary temperature thresholds.

However, preferably the number of auxiliary temperature thresholds comprised between two successive main temperature thresholds is equal to the number of selectable active elements plus one.

Furthermore, the interval of temperature $\Delta T2$ between each successive auxiliary temperature thresholds is preferably inferior or equal to 20 K, and most preferably inferior or equal to 10 K.

As for the first temperature interval $\Delta T1$, the second temperature interval $\Delta T2$ refers to the value of the mean temperature interval between each subsequent auxiliary temperature threshold.

Figure 1:
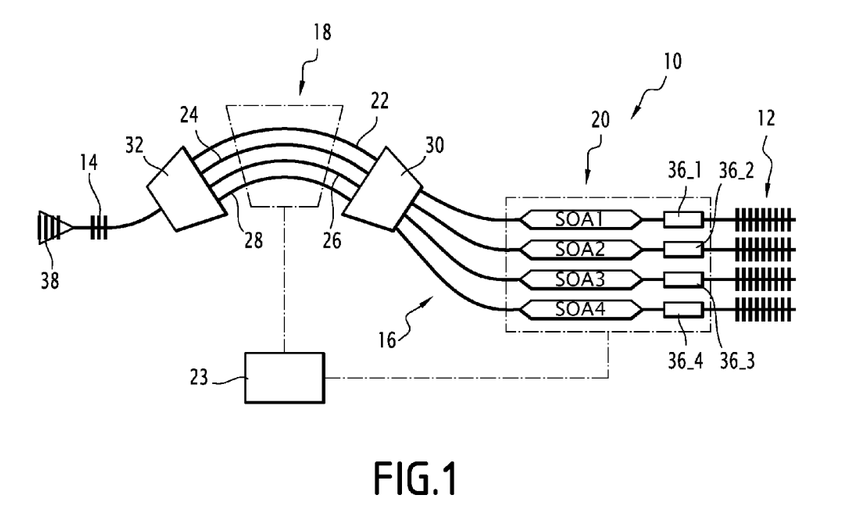
FIG. 1 is an example of a laser source according to a first embodiment.
Figure 4:
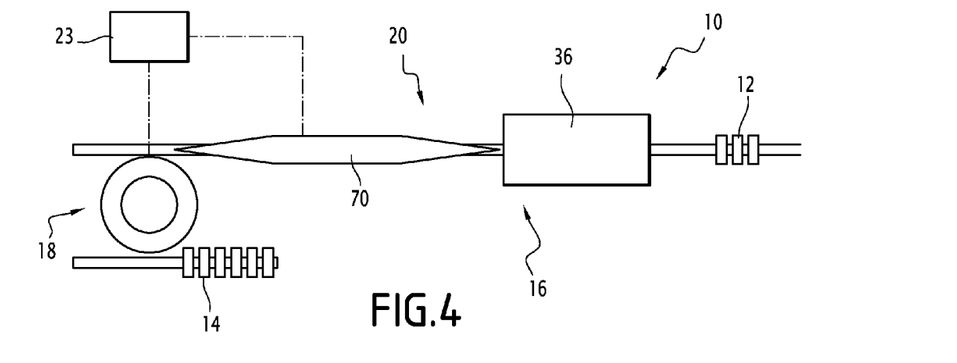
FIG. 4 is an example of a laser source according to a second embodiment.
Figure 6:
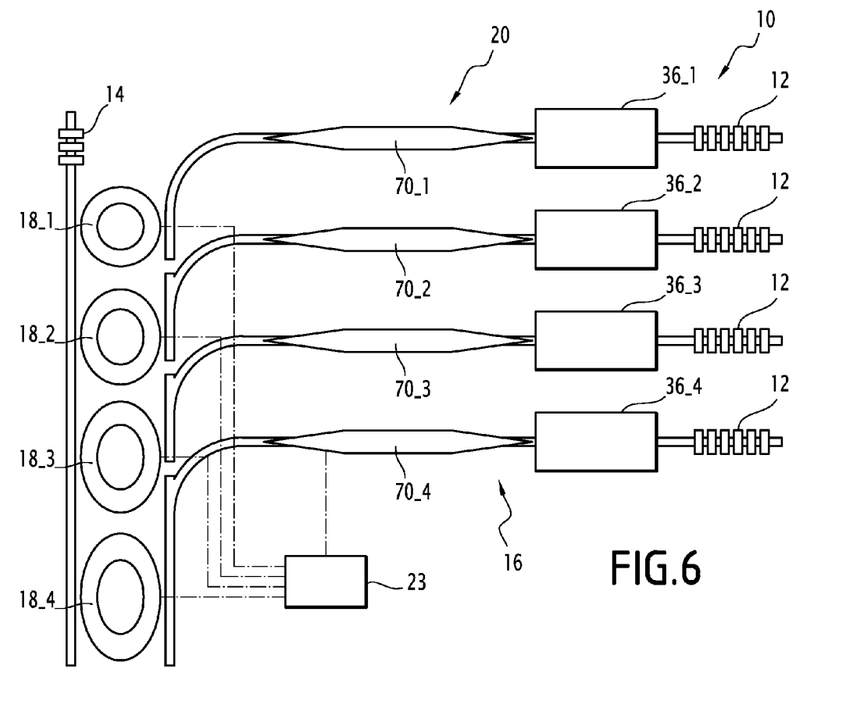
FIG. 6 is an example of a laser source according to a third embodiment.

Several specific examples of laser source 10 are described in reference to FIGS. 1, 4 and 6.

In the example represented on FIG. 1, the optical filter 18 is an arrayed waveguide grating.

Arrayed waveguide gratings (AWG) are commonly used as optical (de)multiplexers in wavelength division multiplexed (WDM) systems. These devices are capable of multiplexing a large number of wavelengths into a single optical fiber, thereby increasing the transmission capacity of optical networks considerably.

The arrayed waveguide grating comprises four optical waveguides 22, 24, 26, 28, a first star coupler 30 and a second star coupler 32.

The active medium 20 comprises four selectable active elements According to the example of FIG. 1, each selectable active element 34 is a semiconductor optical amplifier. Thus, for the remainder of the description, the first selectable active element is labeled SOA1, the second selectable active element labeled SOA2, the third selectable active element is labeled SOA3 and the fourth selectable active element is labeled SOA4.

Each phase section 36_1, 36_2, 36_3 and 36_4 enables to achieve a stable single mode operation for the laser source 10.

The laser source 10 also comprises a vertical grating coupler 38.

Figure 2:
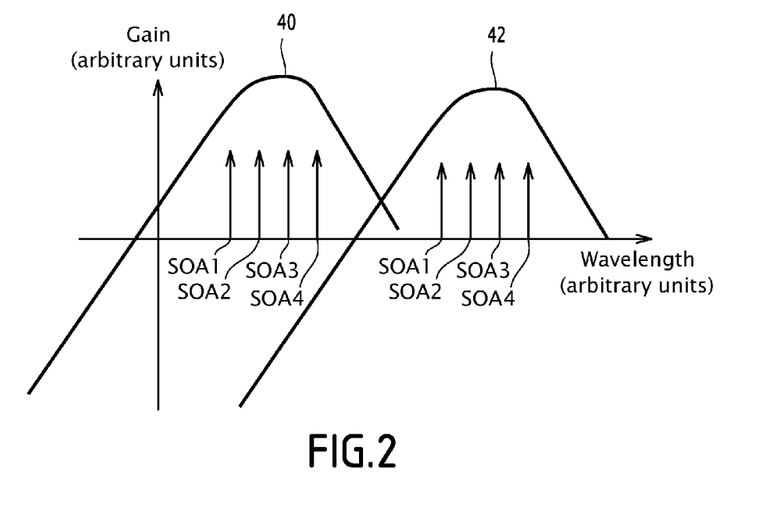
FIG. 2 is a graph illustrating the influence of temperature on gain curves.
Figure 3:
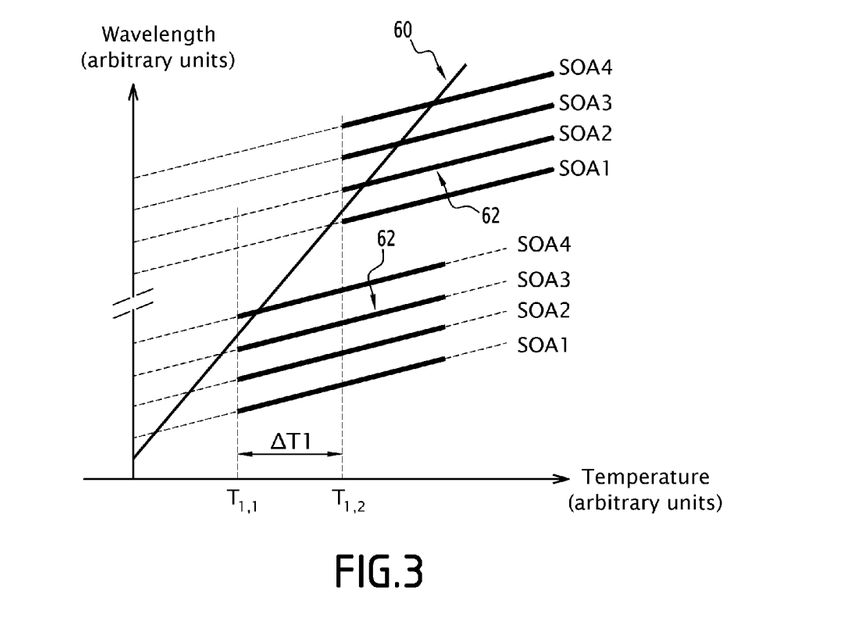
FIG. 3 is a graph showing the variation of optimal wavelength with temperature illustrating a method of controlling the emitting wavelength of the laser source of FIG. 1.

The operating of the laser source 10 is described in reference to FIGS. 2 and 3.

FIG. 2 shows two gain curves 40, 42 of the active medium 20 for two different operation temperatures. For indicative purpose, the possible emitting wavelengths of the laser source 10 are indicated by an arrow. As expected, for each gain curve 40, 42, there are four possible emitting wavelengths since there are four selectable active elements SOA1, SOA2, SOA3 and SOA4. The first gain curve 40 corresponds to a temperature of 5° C. whereas the second gain curve 42 corresponds to a temperature of 55° C. Each gain curve 40 and 42 has a peak wavelength corresponding to the wavelength for which the gain is maximal. It can be observed that there is a wavelength shift between the peak wavelength of the first gain curve 40 and the peak wavelength of the second gain curve 42. In general, this wavelength shift is of 35 nm, which means that the associated shift rate is of 0.7 nm per K.

FIG. 3 illustrates the variation of the peak wavelength of the gain curve of the active medium 20 by a first curve 60. As explained by reference to FIG. 2, the first curve 60 is linear. The variation of the emitting wavelengths is also indicated for two orders of the optical filter 18. Eight curves 62 are thus represented. As the variation of the emitting wavelengths with temperature is of the order of 0.08 nm per K, the eight curves 62 are also linear.

The method for controlling the emitting wavelength of the laser source can be schematically understood as a choice of the most favorable curve among the eight curves 62, the most favorable curve being the curve which is the nearest of the first curve 60 at the measured temperature.

In this case, the method for controlling the emitting wavelength of the laser source 10 is carried out by using three main temperature thresholds $T_{1,1}$, $T_{1,2}$ and $T_{1,3}$ and ten auxiliary temperature thresholds $T_{2,1}$, $T_{2,2}$, $T_{2,3}$, $T_{2,4}$, $T_{2,5}$, $T_{2,6}$, $T_{2,7}$, $T_{2,8}$, $T_{2,9}$, $T_{2,10}$.

As an example, the first main temperature threshold $T_{1,1}$ is equal to −20° C. which means $T_{1,1}$=−20° C.; the second main temperature threshold $T_{1,2}$ is equal to 30° C. which means $T_{1,2}$=30° C. and the third main temperature threshold $T_{1,3}$ is equal to 80° C. which means $T_{1,3}$=80° C.

If the measured temperature $T_{MEASURED}$ ranges from the first main temperature threshold $T_{1,1}$ to the second main temperature threshold $T_{1,2}$, that is $T_{MEASURED}$ ranges from −20° C. to 30° C., then the optical filter 18 is set to a temperature $T_{FILTER}$ which ranges from 30° C. to 110° C. In this way, the optical filter 18 will operate on an order labeled m.

If the measured temperature $T_{MEASURED}$ ranges from the second main temperature threshold $T_{1,2}$ to the third main temperature threshold $T_{1,3}$, that is $T_{MEASURED}$ ranges from 30° C. to 80° C., then the optical filter 18 is set to a temperature $T_{FILTER}$ which ranges from 80° C. to 160° C. This also means that the order of the optical filter 18 in this range of temperature is m+1.

In addition, the first auxiliary temperature threshold $T_{2,1}$ is equal to −20° C. which means $T_{2,1}=T_{1,1}=-20°$ C.; the second auxiliary temperature threshold $T_{2,2}$ is equal to 0° C. which means $T_{2,2}=0°$ C.; the third auxiliary temperature threshold $T_{2,3}$ is equal to 10° C. which means $T_{2,3}=10°$ C.; the fourth auxiliary temperature threshold $T_{2,4}$ is equal to 20° C. which means $T_{2,2}=20°$ C.; the fifth auxiliary temperature threshold $T_{2,5}$ is equal to 30° C. which means $T_{2,5}=T_{1,2}=30°$ C.; the sixth auxiliary temperature threshold $T_{2,6}$ is equal to 30° C. which means $T_{2,6}=T_{2,5}=T_{1,2}=30°$ C.; the seventh auxiliary temperature threshold $T_{2,7}$ is equal to 40° C. which means $T_{2,7}=40°$ C.; the eightieth auxiliary temperature threshold $T_{2,8}$ is equal to 50° C. which means $T_{2,8}=50°$ C.; the ninth auxiliary temperature threshold $T_{2,9}$ is equal to 60° C. which means $T_{2,9}=60°$ C. and the tenth auxiliary temperature threshold $T_{2,10}$ is equal to 80° C. which means $T_{2,10}=T_{1,3}=80°$ C.

If the measured temperature $T_{MEASURED}$ ranges from the first auxiliary temperature threshold $T_{2,1}$ to the second auxiliary temperature threshold $T_{2,2}$, that is $T_{MEASURED}$ ranges from −20° C. to 0° C., then the first selectable active element SOA1 is selected which means the first semiconductor optical amplifier SOA1 is switched on while the other semiconductor optical amplifiers SOA2, SOA3 and SOA 4 are switched off.

If the measured temperature $T_{MEASURED}$ ranges from the second auxiliary temperature threshold $T_{2,2}$ to the third auxiliary temperature threshold $T_{2,3}$, that is $T_{MEASURED}$ ranges from 0° C. to 10° C., then the second selectable active element SOA2 is selected which means the second semiconductor optical amplifier SOA2 is switched on while the other semiconductor optical amplifiers SOA1, SOA3 and SOA 4 are switched off.

If the measured temperature $T_{MEASURED}$ ranges from the third auxiliary temperature threshold $T_{2,3}$ to the fourth auxiliary temperature threshold $T_{2,4}$, that is $T_{MEASURED}$ ranges from 10° C. to 20° C., then the third selectable active element SOA3 is selected which means the third semiconductor optical amplifier SOA3 is switched on while the other semiconductor optical amplifiers SOA1, SOA2 and SOA 4 are switched off.

If the measured temperature $T_{MEASURED}$ ranges from the fourth auxiliary temperature threshold $T_{2,4}$ to the fifth auxiliary temperature threshold $T_{2,5}$, that is $T_{MEASURED}$ ranges from 20° C. to 30° C., then the fourth selectable active element SOA4 is selected which means the fourth semiconductor optical amplifier SOA4 is switched on while the other semiconductor optical amplifiers SOA1, SOA2 and SOA 3 are switched off.

If the measured temperature $T_{MEASURED}$ ranges from the sixth auxiliary temperature threshold $T_{2,6}$ to the seventh auxiliary temperature threshold $T_{2,7}$, that is $T_{MEASURED}$ ranges from 30° C. to 40° C., then the first selectable active element SOA1 is selected which means the first semiconductor optical amplifier SOA1 is switched on while the other semiconductor optical amplifiers SOA2, SOA3 and SOA 4 are switched off.

If the measured temperature $T_{MEASURED}$ ranges from the seventh auxiliary temperature threshold $T_{2,7}$ to the eightieth auxiliary temperature threshold $T_{2,8}$, that is $T_{MEASURED}$ ranges from 40° C. to 50° C., then the second selectable active element SOA2 is selected which means the second semiconductor optical amplifier SOA2 is switched on while the other semiconductor optical amplifiers SOA1, SOA3 and SOA 4 are switched off.

If the measured temperature $T_{MEASURED}$ ranges from the eightieth auxiliary temperature threshold $T_{2,8}$ to the ninth auxiliary temperature threshold $T_{2,9}$, that is $T_{MEASURED}$ ranges from 50° C. to 60° C., then the third selectable active element SOA3 is selected which means the third semiconductor optical amplifier SOA3 is switched on while the other semiconductor optical amplifiers SOA1, SOA2 and SOA 4 are switched off.

If the measured temperature $T_{MEASURED}$ ranges from the ninth auxiliary temperature threshold $T_{2,9}$ to the tenth auxiliary temperature threshold $T_{2,10}$, that is $T_{MEASURED}$ is between 60° C. and 80° C., then the fourth selectable active element SOA4 is selected which means the fourth semiconductor optical amplifier SOA4 is switched on while the other semiconductor optical amplifiers SOA1, SOA2 and SOA 3 are switched off.

In this first embodiment, the laser source 10 is a wavelength selectable laser source. The wavelength tuning is achieved by selecting the appropriate semiconductor optical amplifiers SOA1, SOA2, SOA3 or SOA4 and by heating the optical filter 18.

FIG. 4 illustrates a second embodiment for the laser source 10.

In the example represented on FIG. 4, the optical filter 18 is a ring resonator. A ring resonator comprises an input waveguide, a ring and an output waveguide, both waveguide being coupled to the ring.

It is preferred that the free spectral range be relatively large for the ring resonator 18. To obtain such property, the radius of the ring of the ring resonator should be rendered very small. However, this results in bending losses. To avoid this, the optical filter 18 is alternatively the combination of a ring resonator and a Mach-Zehnder interferometer. In this case, the Mach-Zehnder interferometer is designed to cancel one resonance or peak transmission of the ring resonator over two.

The active medium 20 comprises a waveguide 70 and a phase section 36.

In an alternative, the active medium 20 comprises a waveguide 70 and a heater means having the same role than the phase section 36.

The waveguide 70 is an active waveguide made from a semiconductor material belonging to the group III and a semiconductor material belonging to the group V.

As, for the four phase section 36_1, 36_2, 36_3 and 36_4 of the example of FIG. 1, the phase section 36 enables to achieve a stable single mode operation for the laser source 10.

Figure 5:
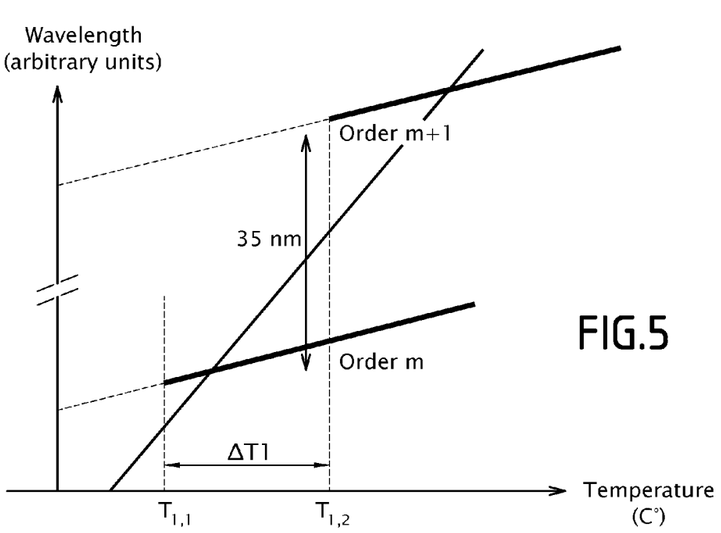
FIG. 5 is a graph showing the variation of optimal wavelength with temperature illustrating a method of controlling the emitting wavelength of the laser source of FIG. 4.

The operating of the laser source 10 according to the second embodiment is described in reference to FIG. 5.

FIG. 5 is similar to FIG. 3. In the graph of FIG. 5, are represented the first curve 60 corresponding to the variation of the peak wavelength of the gain curve of the active medium 20 and two curves 80, 82 corresponding to the variation of the emitting wavelengths for two orders of the optical filter 18. As the variation of the emitting wavelengths with temperature is of the order of 0.08 nm per K, the two curves 80, 82 are also linear.

In this case, the method for controlling the emitting wavelength of the laser source 10 is carried out by using three main temperature thresholds $T_{1,1}$, $T_{1,2}$ and $T_{1,3}$.

As an example, the first main temperature threshold $T_{1,1}$ is equal to −20° C. which means $T_{1,1}=-20°$ C.; the second main temperature threshold $T_{1,2}$ is equal to 30° C. which means $T_{1,2}=30°$ C. and the third main temperature threshold $T_{1,3}$ is equal to 80° C. which means $T_{1,3}=80°$ C.

If the measured temperature $T_{MEASURED}$ ranges from the first main temperature threshold $T_{1,1}$ to the second main temperature threshold $T_{1,2}$, that is $T_{MEASURED}$ ranges from −20° C. to 30° C., then the ring resonator 18 is set to a temperature $T_{FILTER}$ ranging from 30° C. to 110° C. In this way, the optical filter 18 will operate on an order labeled m.

If the measured temperature $T_{MEASURED}$ ranges from the second main temperature threshold $T_{1,2}$ to the third main temperature threshold $T_{1,3}$, that is $T_{MEASURED}$ ranges from 30° C. to 80° C., then the temperature $T_{FILTER}$ of the ring resonator 18 is set a temperature $T_{FILTER}$ ranging from 80° C. to 160° C. This also means that the order of the optical filter 18 in this range of temperature is m+1.

In this case, the laser source 10 is a wavelength tunable laser source.

FIG. 6 illustrates a third embodiment for the laser source 10 which corresponds to an improved design of the second embodiment.

In this third embodiment, there are four lasers having the same structure than the laser source 10 of the second embodiment. Accordingly, in the third embodiment, the optical filter 18 comprises four ring resonators 18_1, 18_2, 18_3 and 18_4 with different radius and the active medium 20 comprises four waveguides 70_1, 70_2, 70_3, 70_4 associated to a respective phase section 36_1, 36_2, 36_3 and 36_4.

The four ring resonators 18_1, 18_2, 18_3 and 18_4 have an input waveguide, a ring and an output waveguide. In the third embodiment, the output waveguide is the same for each four ring resonators 18_1, 18_2, 18_3 and 18_4.

Each waveguide 70_1, 70_2, 70_3, 70_4 is similar to the waveguide 70 described with reference to FIG. 4. In addition, preferably, each waveguide 70_1, 70_2, 70_3, 70_4 is adapted to emit a wave at a different frequency. Thus, the waveguide 70_1, 70_2, 70_3, 70_4 can be assimilated to the semiconductor optical amplifiers SOA1, SOA2, SOA3 and SOA4 of the first embodiment.

The phase sections 36_1, 36_2, 36_3 and 36_4 play the same role than the phase sections 36_1, 36_2, 36_3 and 36_4 of the first embodiment.

The operating of the laser source 10 according to the third embodiment is similar to the operating of the laser source 10 according to the first embodiment. The method for controlling the emitting wavelength of a laser source 10 according to the third embodiment is therefore not described.

In this case, the laser source 10 is a wavelength selectable laser source.

Figure 7:
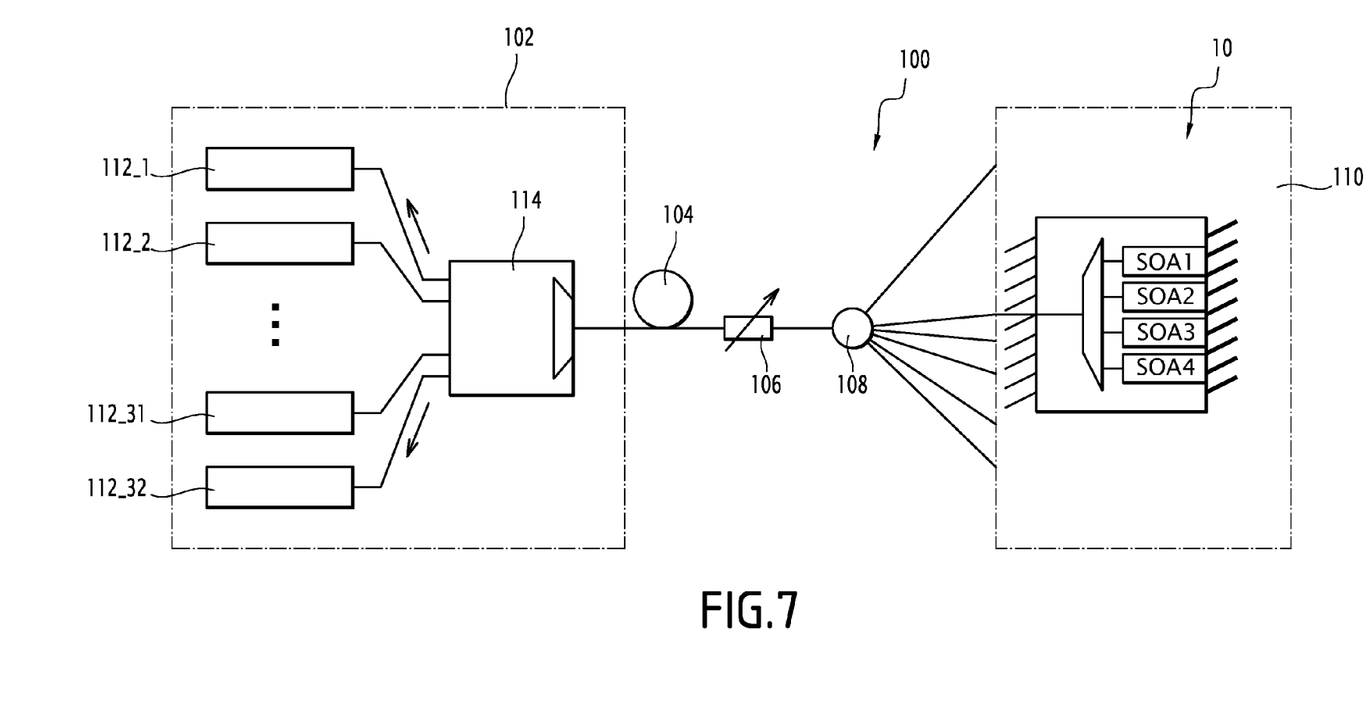
FIG. 7 is an example of passive optical network comprising the laser source of FIG. 1.

The laser source 10 is particularly adapted to be used in a ONU transmitter for NG-PON2 as shown on FIG. 7.

FIG. 7 illustrates a network 100 comprising an optical line termination 102, an optical fiber 104, an attenuator 106, a splitter 108 and an optical network unit 110.

An optical line termination 102 is also called an optical line terminal and often labeled after its acronym OLT which is used in the remainder of the specification. An OLT is a device which serves as the service provider endpoint of a passive optical network. An OLT provides two main functions which are performing conversion between the electrical signals used by the service provider's equipment and the fiber optic signals used by the passive optical network and coordinating the multiplexing between the conversion devices on the other end of that network 100 which is the optical network unit 110.

In the example of FIG. 7, the OLT 102 comprises thirty-two channels 112_1, 112_2 . . . 112_32 (only four being represented on FIG. 7) and a multiplexer 114.

The optical network unit 110, often labeled after its acronym ONU, is a device that transforms incoming optical signals into electronics at a customer's premises in order to provide telecommunications services over the network 100.

The optical network unit 110 comprises the laser source 10 according to the first embodiment.

Compared to a network using DFB lasers, the possible number N of channels of the OLT 102 is higher. Indeed, this number N corresponds to the product of the number of channels the OLT 102 would have in a network using DFB lasers with the number of selectable active elements SOA1, SOA2, SOA3 and SOA4 which are part of the laser source 10.

For instance, each selectable active element SOA1, SOA2, SOA3 and SOA4 allows to achieve 400 GHz wavelength tuning through the heating of the optical filter 18. The optical filter 18 has a free spectral range of 400 GHz. The total tuning range is thus 4×400 GHz. If the channel spacing for the multiplexer 114 is 50 GHz, only 8 channels would be possible in a network using DFB lasers whereas the proposed architecture would allow to achieve 4×8=32 channels.

A higher number of channels can be obtained by integrating more selectable active elements in the laser source 10. For instance, forty selectable active elements may be considered.

Furthermore, the above-mentioned reasoning also shows that for access applications are that, it is preferable to use a cyclic optical filter, the cycle corresponding to a frequency interval of the order of 800 GHz. In addition, the free spectral range of the optical filter 18 should be a multiple of the product of the channel spacing of the multiplexer 114 by the number of selectable active elements in the laser source 10. Both conditions can be easily obtained. Typically, the free spectral range may be of the order of 35 nm.

The embodiments and alternative embodiments considered here-above can be combined to generate further embodiments of the invention.

The invention claimed is:

1. A method for controlling the emitting wavelength of a laser source for a passive optical network, the laser source comprising:
   a first Bragg mirror,
   a second Bragg mirror,
   a cavity delimited by both Bragg mirrors the cavity comprising an optical filter and an active medium,
   the method comprising the steps of:
      measuring the temperature of the active medium,
      setting the temperature of the optical filter in accordance with the measured temperature of the active medium, the temperature of the optical filter being higher than the measured temperature;
   wherein the method further comprises a step of comparing the measured temperature of the active medium with at least two main temperature thresholds.

2. The method according to claim 1, wherein the method further comprises a step of comparing the measured temperature of the active medium with at least two main temperature thresholds, the temperature of the optical filter being set to a temperature ranging from a first number to a second number, wherein:
   the first number is the sum of the main temperature threshold which is the nearest inferior to the measured temperature and the mean interval of temperature between each successive main temperature thresholds, and the second number is the sum of the main temperature threshold which is the nearest inferior to the measured temperature and the product of the mean interval of temperature between each successive main temperature thresholds by a constant, the constant ranging from 1 to 3.

3. The method according to claim 2, wherein the interval of temperature between each successive main temperature thresholds is constant.

4. The method according to claim 3, wherein the mean interval of temperature between each successive main temperature thresholds is inferior or equal to 60 K.

5. The method according to claim 2, wherein the mean interval of temperature between each successive main temperature thresholds is inferior or equal to 60 K.

6. The method according to claim 2, wherein the number of auxiliary temperature thresholds comprised between two successive main temperature thresholds is equal to the number of selectable active elements plus one.

7. The method according to claim 6, wherein the mean interval of temperature between each successive auxiliary temperature thresholds is inferior or equal to 20 K.

8. The method according to claim 1, wherein the active medium is made from at least one semiconductor material belonging to the group III of the Periodic Table of Elements and at least one semiconductor material belonging to the group V of the Periodic Table of Elements.

9. The method according to claim 1, wherein the laser source is a monolithic integrated source.

10. The method according to claim 1, wherein the step of setting further comprises:

providing data relative to the evolution with temperature of the gain wavelength for the active medium, the gain wavelength corresponding to a gain curve peaks of the active medium for the cavity, determining the gain wavelength at the measured temperature with the provided data, determining the nearest superior temperature to the measured temperature to impose to the optical filter such that the transmission function of the optical filter exhibits a peak of transmission at the determined wavelength, and heating the optical filter to the nearest superior temperature determined.

11. The method according to claim 1, wherein the step of setting further comprises:

providing data relative to the evolution with temperature of the gain wavelength for the active medium, the gain wavelength corresponding to a gain curve peaks of the active medium for the cavity, determining the gain wavelength at the measured temperature with the provided data, determining the nearest superior temperature to the measured temperature to impose to the optical filter such that the transmission function of the optical filter exhibits a peak of transmission at the determined wavelength, and heating the optical filter to the nearest superior temperature determined.

12. The method according to claim 1, wherein the active medium comprises several selectable active elements and the method further comprises the step of selecting one active element in accordance with the measured temperature ($T_{MEASURED}$) of the active medium.

13. The method according to claim 12, wherein the method further comprises a step of comparing the measured temperature of the active medium with at least one auxiliary temperature threshold, the active element being selected in accordance with the auxiliary temperature threshold(s) to which the measured temperature is superior.

14. The method according to claim 13, wherein the mean interval of temperature between each successive auxiliary temperature thresholds is inferior or equal to 20 K.

15. The method according to claim 12, wherein the active medium comprises at least four selectable active elements.

16. The method according to claim 1, wherein the optical filter is chosen in the group consisting of an arrayed waveguide grating, a ring resonator, several ring resonators sharing the same output waveguides and a combination of a ring resonator and a Mach-Zehnder interferometer.

17. A laser source for a passive optical network comprising:

a first Bragg mirror, a second Bragg mirror, a cavity delimited by both Bragg mirrors, the cavity comprising an optical filter and an active medium, and a controller adapted to carry out the method for controlling the emitting wavelength of the laser source according to claim 1.

18. An optical network unit comprising a laser source according to claim 17.

19. A laser source for a passive optical network comprising:

a first Bragg mirror, a second Bragg mirror, a cavity delimited by both Bragg mirrors, the cavity comprising an optical filter and an active medium, and a controller adapted to carry out the method for controlling the emitting wavelength of the laser source according to claim 1.

* * * * *